(12) United States Patent
Liu et al.

(10) Patent No.: US 9,466,528 B2
(45) Date of Patent: Oct. 11, 2016

(54) METHOD OF MAKING A STRUCTURE

(71) Applicant: TAIWAN SEMICONDUCTOR MANUFACTURING COMPANY, LTD., Hsinchu (TW)

(72) Inventors: Chia-Chu Liu, Shin-Chu (TW); Yi-Shien Mor, Hsinchu (TW); Kuei-Shun Chen, Hsinchu (TW); Yu Lun Liu, Beidou Township (TW); Han-Hsun Chang, Hsinchu (TW); Shiao-Chian Yeh, Kaohsiung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 78 days.

(21) Appl. No.: 14/507,101

(22) Filed: Oct. 6, 2014

(65) Prior Publication Data

US 2015/0037976 A1 Feb. 5, 2015

Related U.S. Application Data

(62) Division of application No. 13/370,828, filed on Feb. 10, 2012, now Pat. No. 8,872,339.

(51) Int. Cl.
*H01L 21/768* (2006.01)
*H01L 21/3213* (2006.01)
*H01L 27/06* (2006.01)

(52) U.S. Cl.
CPC ... *H01L 21/76879* (2013.01); *H01L 21/32139* (2013.01); *H01L 21/76802* (2013.01); *H01L 21/76885* (2013.01); *H01L 27/0629* (2013.01); *H01L 2924/0002* (2013.01)

(58) Field of Classification Search
CPC .......... H01L 21/76879; H01L 21/76802; H01L 21/321139; H01L 21/76885; H01L 27/0629
See application file for complete search history.

(56) References Cited

U.S. PATENT DOCUMENTS

| | | | |
|---|---|---|---|
| 5,814,553 A | | 9/1998 | Chuang et al. |
| 6,133,115 A | * | 10/2000 | Fukase ............ H01L 21/8234 257/E21.555 |
| 6,403,487 B1 | * | 6/2002 | Huang ............ H01L 21/823456 257/E21.624 |
| 6,436,412 B1 | | 8/2002 | Quinn |
| 7,972,926 B2 | | 7/2011 | Kewley et al. |
| 8,227,861 B2 | * | 7/2012 | Yang ............ H01L 29/1041 257/335 |
| 8,476,763 B2 | | 7/2013 | Kim et al. |
| 2006/0152668 A1 | | 7/2006 | Jang et al. |
| 2007/0184664 A1 | * | 8/2007 | Lee ............ H01L 21/31116 438/706 |
| 2008/0303037 A1 | | 12/2008 | Irving et al. |
| 2009/0075489 A1 | * | 3/2009 | Wang ............ C23C 16/045 438/787 |
| 2009/0101988 A1 | | 4/2009 | Kohli |
| 2009/0207662 A1 | | 8/2009 | Wang et al. |
| 2009/0253263 A1 | | 10/2009 | Lee et al. |
| 2010/0327396 A1 | * | 12/2010 | Park ............ H01L 27/0207 257/506 |

(Continued)

*Primary Examiner* — Minh-Loan Tran
*Assistant Examiner* — Farid Khan
(74) *Attorney, Agent, or Firm* — Hauptman Ham, LLP

(57) ABSTRACT

A method of making a structure includes forming a first supporting member over a substrate, the first supporting member comprising a first material and having a first width defined along a reference plane. The method further includes forming a second supporting member over the substrate, the second supporting member having a second width defined along the reference plane, and the first supporting member and the second supporting member being separated by a gap region. The first width is at least 10 times the second width, and a gap width of the gap region being from 5 to 30 times the second width.

20 Claims, 5 Drawing Sheets

(56) References Cited

U.S. PATENT DOCUMENTS

| | | |
|---|---|---|
| 2011/0003469 A1 | 1/2011 | Kewley et al. |
| 2011/0089500 A1* | 4/2011 | Yang .................. H01L 29/1041 257/408 |
| 2011/0237081 A1 | 9/2011 | Kewley et al. |
| 2011/0241119 A1 | 10/2011 | Chen et al. |
| 2011/0285036 A1 | 11/2011 | Yao et al. |
| 2011/0294286 A1 | 12/2011 | Hung et al. |
| 2012/0015494 A1* | 1/2012 | Kobayashi ........ H01L 27/10852 438/386 |
| 2012/0193792 A1 | 8/2012 | Kim et al. |
| 2013/0200487 A1 | 8/2013 | Park et al. |

\* cited by examiner

US 9,466,528 B2

METHOD OF MAKING A STRUCTURE

PRIORITY CLAIM

The present application is a divisional of U.S. application Ser. No. 13/370,828, filed Feb. 10, 2012, which is incorporated herein by reference in its entirety.

BACKGROUND

In the course of integrated circuit (IC) evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. Meanwhile, some components and devices in an IC chip still have a relatively larger size for applications such as analog circuits or high-power circuits than those for applications such as digital circuits. Various manufacturing processes have been introduced to effectively components and devices having various sizes in a single IC chip.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1A:
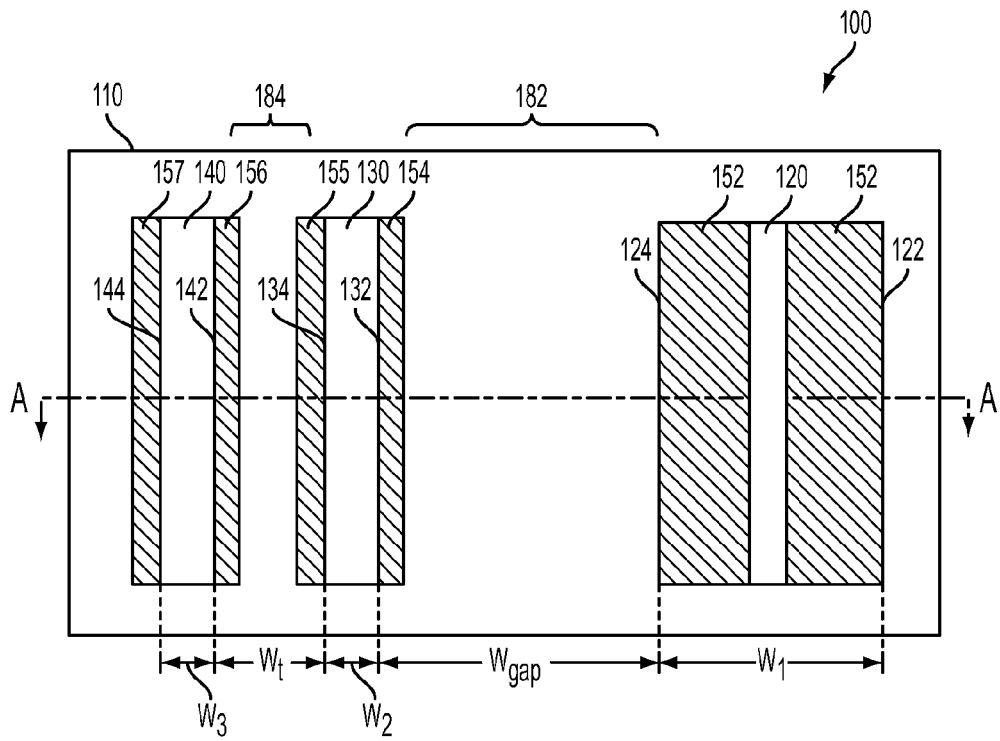
FIG. 1A is a top view of a structure in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1B:
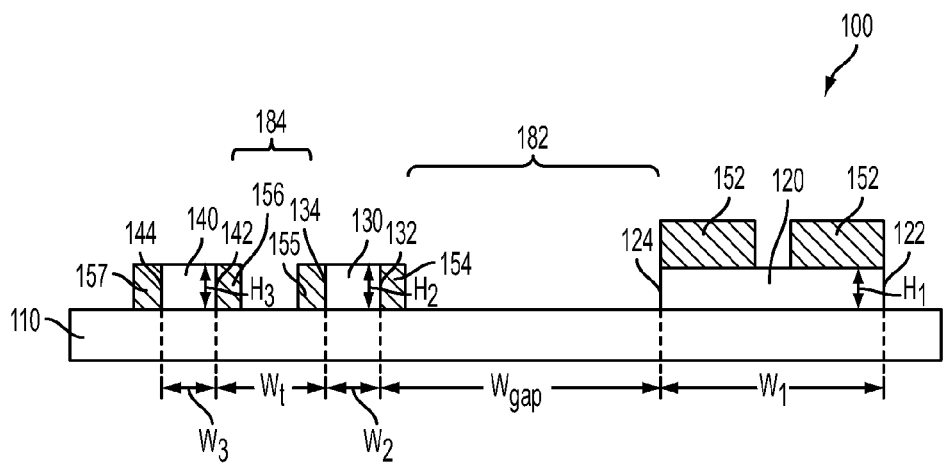
FIG. 1B is a cross-sectional view of the structure of FIG. 1A taken from line A in accordance with one or more embodiments.

FIG. 1A is a top view of a structure 100 in accordance with one or more embodiments. FIG. 1B is a cross-sectional view of the structure 100 of FIG. 1A taken from line A in accordance with one or more embodiments. The structure 100 includes a substrate 110, a first supporting member 120 having side walls 122 and 124, a second supporting member 130 having side walls 132 and 134, and a third supporting member 140 having side walls 142 and 144. The first, second, and third supporting members 120, 130, and 140 are over the substrate 110. In at least one embodiment, the first supporting member 120, the second supporting member 130, and the third supporting member 140 are parallel with one another. In some embodiments, the structure 100 further includes one or more patterned features 152 over the first supporting member 120, one or more strips 154 or 155 on side walls 132 or 134 of the second supporting member 130, and one or more strips 156 and 157 on side walls 142 or 144 of the third supporting member 140. In some embodiments, the patterned features 152 are conductive features, and the strips 154, 155, 156, and 157 are conductive strips. In some embodiments, the structure 100 is a semiconductor structure.

In some embodiments, the substrate 110 includes: an elemental semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 110 is an alloy semiconductor substrate having a gradient SiGe feature in which the respective Si and Ge concentrations change from one ratio at one location to another ratio at another location of the gradient SiGe feature. In another embodiment, the alloy SiGe is formed over a silicon substrate. In yet another embodiment, a SiGe substrate is strained. In some embodiments, the semiconductor substrate 110 has a semiconductor-on-insulator (SOI) structure. In some embodiments, the semiconductor substrate 110 includes a doped epitaxial layer or a buried layer. In other examples, the compound semiconductor substrate has a multilayer structure, or the substrate includes a multilayer compound semiconductor structure.

The first supporting member 120 has a first width $W_1$ defined as a distance between the side walls 122 and 124 at the points of intersection of a reference cross-sectional plane containing the line A and being perpendicular to a planar direction of the substrate 110. The first supporting member 120 also has a first height $H_1$ measurable along the reference cross-sectional plane. The second supporting member 130 has a second width $W_2$ defined as a distance between the side walls 132 and 134 at the points of intersection of the reference cross-sectional plane. The second supporting member 130 also has a second height $H_2$ measurable along the reference cross-sectional plane. The third supporting member 140 has a third width $W_3$ defined as a distance between the side walls 142 and 144 at the points of intersection of the reference cross-sectional plane. The third supporting member 140 also has a third height $H_3$ measurable along the reference cross-sectional plane.

The first supporting member 120 and the second supporting member 130 are separated by a gap region 182. The gap region 182 has a gap width $W_{gap}$ defined as a distance between the side wall 124 and the sidewall 132 along the reference cross-sectional plane. Also, the second supporting member 130 and the third supporting member 140 are separated by a trench region 184. The trench region 184 has a trench width $W_t$ defined as a distance between the side wall 134 and the sidewall 142 along the reference cross-sectional plane.

Figure 3A:
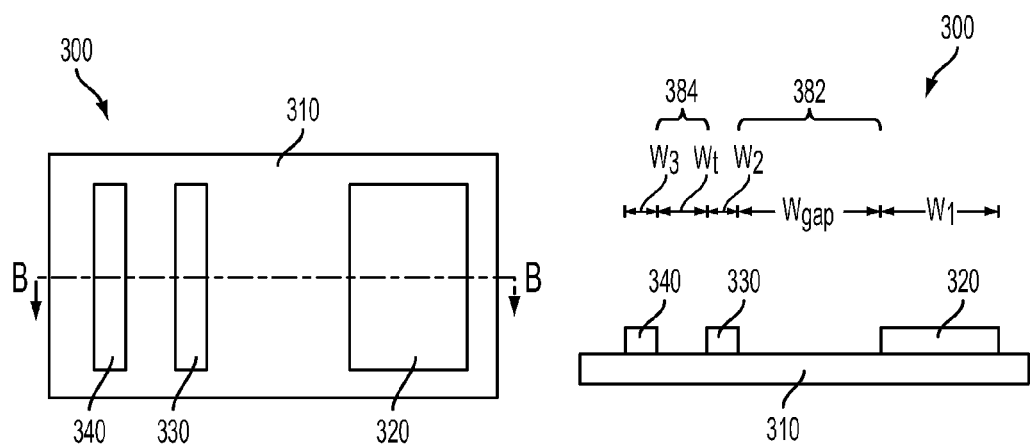
FIGS. 3A-3G are top views and corresponding cross-sectional views of a structure at various manufacturing stages in accordance with one or more embodiments.
Figure 3B:
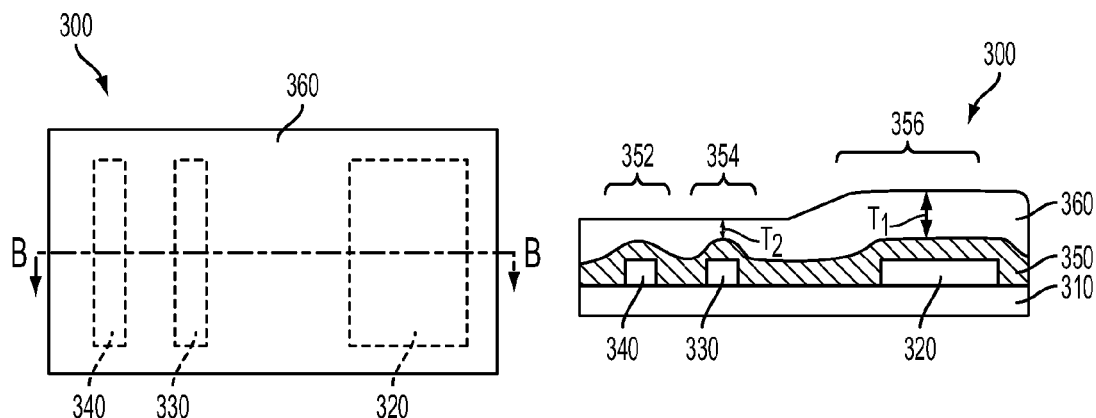

In some embodiments, the gap region 180 is substantially free of any feature that interferes with formation of the photoresist layer 360 as depicted in FIG. 3B.

In some embodiments, the first width $W_1$ is at least 10 times the second width $W_2$, and the gap width $W_{gap}$ of the gap region 180 ranges from 5 to 30 times the second width $W_2$. In some embodiments, the second width $W_2$ ranges from 0.8 to 1.2 times the third width $W_3$. In some embodiments, the trench width $W_t$ ranges from 2.0 to 3.0 times the second width $W_2$.

In some embodiments, the second width $W_2$ is equal to or less than 100 nm. In at least one embodiment, the second width $W_2$ ranges from 30 nm to 90 nm, the first width $W_1$ ranges from 300 nm to 900 nm, and the gap width $W_{gap}$ ranges from 200 nm to 1,000 nm.

In some embodiments, the first height $H_1$ ranges from 30 nm to 90 nm. In some embodiments, the second height $H_2$ ranges from 30 nm to 90 nm. In some embodiments, the third height $H_3$ ranges from 30 nm to 90 nm.

The first supporting member 120 is not limited to any particular size. In some embodiments, when viewed from the top as in FIG. 1A, the first supporting member 120 has a dimension ranging from 300 nm to 30,000 nm. In some embodiments, the range is from 500 nm to 2,000 nm or from 700 nm to 1,500 nm.

The second or third supporting members 130 or 140 are not limited to any particular size. In some embodiments, when viewed from the top as in FIG. 1A, the second supporting member 130 or the third supporting member 140 independently has a length ranging from 300 nm to 30,000 nm. In some embodiments, the range is from 500 nm to 2,000 nm or from 700 nm to 1,500 nm.

The first supporting member 120 is not limited to any particular shape. In some embodiments, the first supporting member 120 has a shape that lacks symmetry. In some embodiments, the first supporting member 120 has symmetry. In some embodiments, when viewed from the top, the first supporting member 120 has a shape that is rectangular, circular, or triangular.

The second or third supporting member 130 or 140 is not limited to any particular shape. In some embodiments, the second or third supporting member 130 or 140 has a shape that lacks symmetry. In some embodiments, the second or third supporting member 130 or 140 has symmetry. In some embodiments, when viewed from the top, the second or third supporting member 130 or 140 has a shape that is rectangular, circular, or triangular. In some embodiments, the second and third supporting members 130 and 140 have substantially the same shape. In some embodiments, the second and third supporting members 130 and 140 have different shapes.

In at least one embodiment, the first, second, and third supporting members 120, 130, and 140 are rectangular and arranged to be in parallel with one another.

In some embodiments, the third supporting member 140 is omitted.

In some embodiments, the first supporting member 120, the second supporting member 130, and the third supporting member 140 include a first material chosen from insulation materials. In some embodiments, the insulation materials include silicon dioxide or silicon nitride. In some embodiments, the first supporting member 120, the second supporting member 130, and the third supporting member 140 are formed of different materials.

In at least one embodiment, the patterned features 152 are usable for forming relatively larger components and devices such as capacitors, antennas, or resistors in an IC chip.

In some embodiments, the strips 154, 155, 156, and 157 are usable for forming relatively smaller components and devices such as electrodes or dummy gate electrodes of transistors in the same IC chip.

In some embodiments, the patterned features 152 and the strips 154, 155, 156, and 157 include a material chosen from conductive materials. In some embodiments, the conductive materials include polycrystalline silicon. In some embodiments, the patterned features 152 and the strips 154, 155, 156, and 157 are formed of different materials. In some embodiments, the patterned features 152 and the strips 154, 155, 156, and 157 include any suitable materials for use in semiconductor manufacturing, such as metallic materials, semiconductor materials, dielectric materials, or hardmask materials. In some embodiments, the patterned features 152 and the strips 154, 155, 156, and 157 comprise silicon nitride, silicon oxide, nitride with carbide doped, oxynitride, aluminum oxide, or carbide.

The widths $W_1$, $W_2$, $W_3$, $W_{gap}$, and/or $W_t$ are determinable by one of ordinary skill in the art using, e.g., any suitable metrology tool.

In some embodiments, the first supporting member 120, the second supporting member 130, and the third supporting member 140 are rectangular, and the reference cross-sectional plane is positioned anywhere along the structure 100. In some embodiments, the reference cross-sectional plane is positioned where the above-mentioned relationships among the widths $W_1$, $W_2$, $W_3$, $W_{gap}$, and/or $W_t$ are satisfied.

Figure 2:
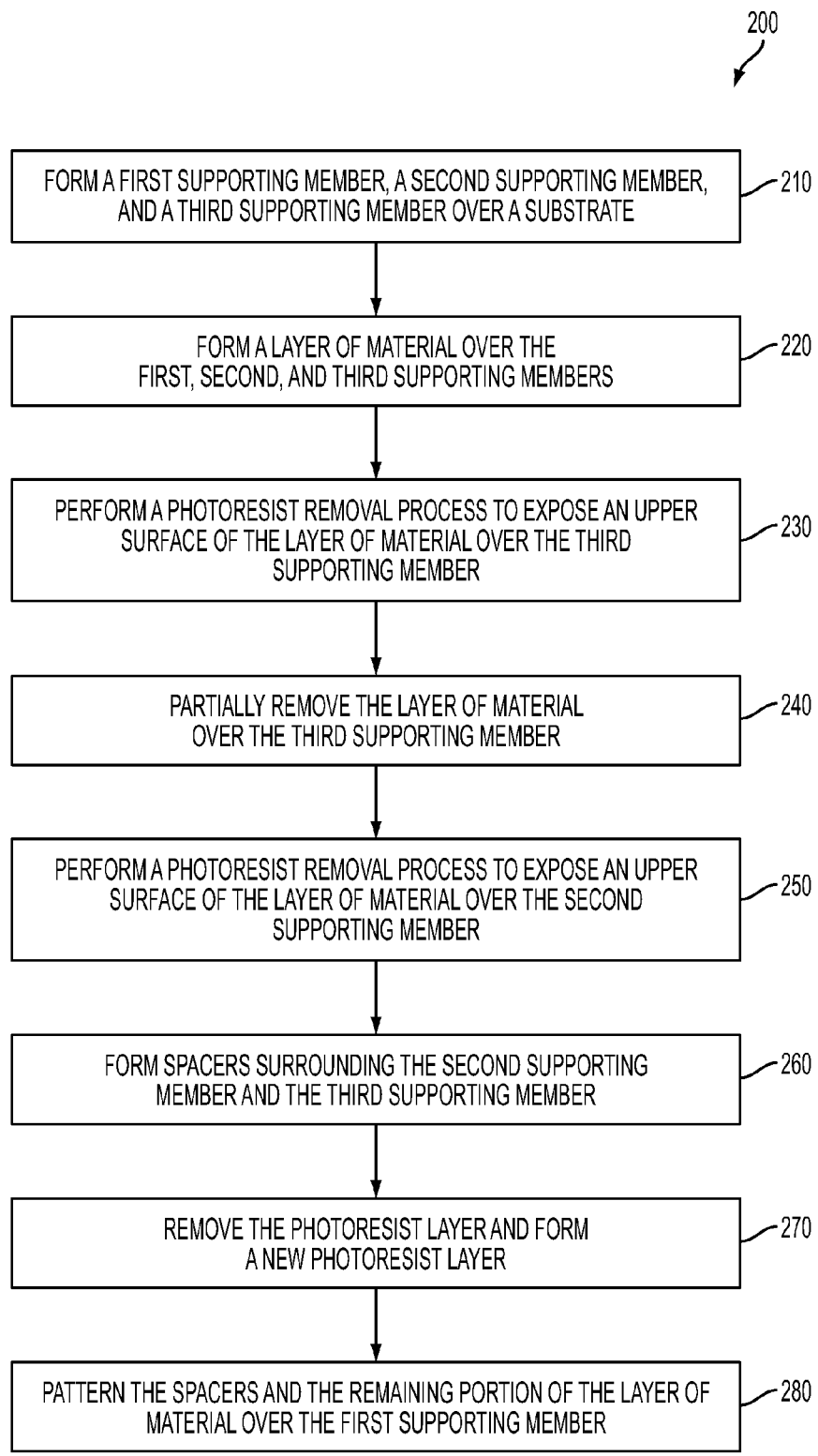
FIG. 2 is a flow chart of a method of manufacturing a structure in accordance with one or more embodiments.

FIG. 2 is a flow chart of a method 200 of manufacturing a semiconductor structure (such as the semiconductor 300 depicted in FIG. 3G) in accordance with one or more embodiments. FIGS. 3A-3G are top views and corresponding cross-sectional views, taken from line B depicted in the top views, of a semiconductor structure 300 at various manufacturing stages in accordance with one or more embodiments. In some embodiments, the semiconductor structure 300 is usable as the structure 100 of FIG. 1A and FIG. 1B. It is understood that additional processes may be performed before, during, and/or after the method 200 depicted in FIG. 2, and that some other processes may only be briefly described herein. Others will be ascertainable to those having ordinary skill in the art.

As depicted in FIG. 2 and FIG. 3A, in operation 210, a first supporting member 320, a second supporting member 330, and a third supporting member 340 are formed over a substrate 310. The third supporting member 340 is farther from the first supporting member 320 than the second supporting member 330. The substrate 310 corresponds to the substrate 110 in FIG. 1, and the first supporting member 320, the second supporting member 330, and the third supporting member 340 correspond to the first supporting member 120, the second supporting member 130, and the third supporting member 140 in FIG. 1. Therefore, the widths of and the spacing between the first supporting member 320, the second supporting member 330, and the third supporting member 340 have analogous relationships as described above for the first supporting member 120, the second supporting member 130, and the third supporting member 140 in FIG. 1.

For example, the first supporting member 320 has a width (also denoted as $W_1$), the second supporting member 330 has a width (also denoted as $W_2$), and the third supporting member 340 has a width (also denoted as $W_3$). The first supporting member 320 and the second supporting member 330 are separated by a gap region 382 having a gap width (also denoted as $W_{gap}$). Also, the second supporting member 330 and the third supporting member 340 are separated by a trench region 384 having a trench width (also denoted as $W_t$).

In some embodiments, the gap region 382 is substantially free of any feature that interferes with formation of the photoresist layer 360 as depicted in FIG. 3B.

In some embodiments, each of the first supporting member 320, the second supporting member 330, and the third supporting member 340 independently comprises silicon dioxide or silicon nitride. In some embodiments, the first supporting member 320, the second supporting member 330, and the third supporting member 340 are formed by first forming a layer of supporting material followed by performing a patterning process to pattern the layer of supporting material. In some embodiments, the formation of the layer of supporting material includes performing a chemical vapor deposition (CVD), a physical vapor deposition (PVD), or a thermal oxidation process. In some embodiments, the patterning process for forming the first supporting member 320, the second supporting member 330, and the third supporting member 340 includes forming a patterned mask over the layer of supporting material and then partially removing the layer of material by a dry etching process or a wet etching process to form the supporting members 320, 330, and 340.

In some embodiments, the third supporting member 340 is omitted. In some embodiments, one or more supporting members resembling the second or third supporting member 330 or 340 are formed to the left of the third supporting member 340 (i.e., the direction away from the first supporting member 320).

As depicted in FIG. 2 and FIG. 3B, in operation 220, a layer of material 350 is formed over the substrate 310 and covering upper surfaces and sidewalls of the first supporting member 320, the second supporting member 330, and the third supporting member 340 at least along the reference plane containing the line B and being perpendicular to an planar direction of the substrate 310. The layer of material 350 includes a portion 352 over and covering the third supporting member 350, a portion 354 over and covering the second supporting member 330, and a portion 356 over and covering the first supporting member 320. In some embodiments, the layer of material 350 includes any suitable materials for use in semiconductor manufacturing, such as metallic materials, semiconductor materials, dielectric materials, or hardmask materials. In some embodiments, the layer of material 350 comprises silicon nitride, silicon oxide, nitride with carbide doped, oxynitride, aluminum oxide, or carbide. In at least one embodiment, the layer of material 350 includes a conductive material such as polycrystalline silicon.

Returning to FIG. 2, in operation 230, a photoresist layer 360 is formed over the layer of material 350. The photoresist layer 360 has a first thickness $T_1$ over the first supporting member 320 and a second thickness $T_2$ over the second supporting member 330. In some embodiments, $W_1$, $W_2$, and $W_{gap}$ are chosen such that the photoresist layer 350 will be thicker over the first supporting member 320 than over the second supporting member 330 during the deposition or coating of the photoresist layer 360 over the first and second supporting members 320 and 330. In some embodiments, the first thickness $T_1$ is greater than the second thickness $T_2$. In some embodiments, the first thickness $T_1$ is at least 50 nm greater than the second thickness $T_2$.

In some embodiments, the photoresist layer 360 includes a light-sensitive material usable to form a patterned coating on a surface. In some embodiments, the photoresist layer 360 includes negative photoresist materials or positive photoresist materials. In some embodiments, the photoresist layer 360 comprises acrylates, such as poly(methyl methacrylate); imides, such as poly(methyl glutarimide), phenols such as phenol formaldehyde resin, or epoxies such as SU-8. In some embodiments, the photoresist layer 360 comprises acrylate or methacrylate monomer.

Figure 3C:
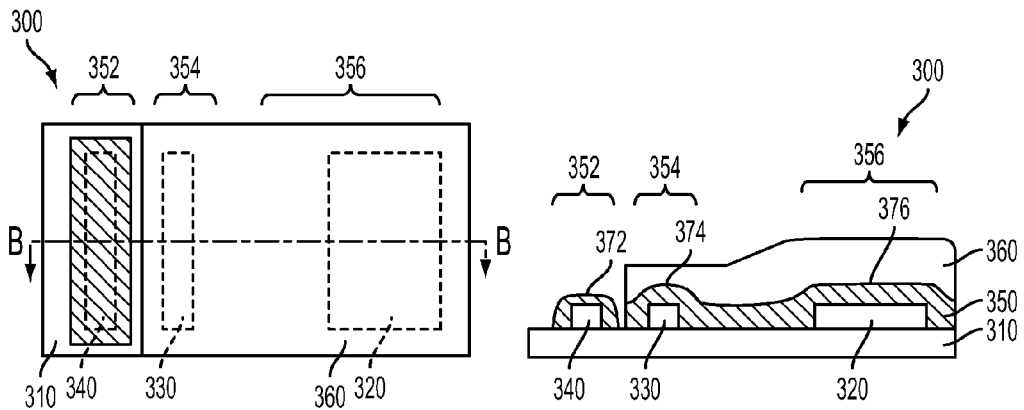

As depicted in FIG. 2 and FIG. 3C, in operation 230, a photoresist removal process is performed to expose an upper surface 372 of the portion 352 of the layer of material 350 over and covering the third supporting member 340, without exposing upper surfaces 374 and 376 of other portions (such as the portions 354 and 356) of the layer of material 350. In some embodiments, the photoresist removal process includes partially exposing the photoresist layer 360 by using a lithographic process and subsequently removing the exposed portion of the photoresist layer 360 by using a photoresist development process.

As depicted in FIG. 2 and FIG. 3C, in operation 240, the exposed portion 352 of the layer of material 350 is partially removed by performing an etching process. In at least one embodiment, the removal process in operation 240 is configured to fabricate a space 352' (FIG. 3E) surrounding the third supporting member 340 having a thickness thinner than a space 352' (FIG. 3E) surrounding the second supporting member 330 after the performance of operation 260 (FIG. 2). In some embodiments, the third supporting member 340 is omitted. In some embodiments, operations 230 and 240 are omitted, and thus the second supporting member 330 and the third supporting member 340 are identically processed. During the etching process, the photoresist layer 360 is used as a mask to protect the portions 374 and 376 of the layer of material 350 from being removed.

Figure 3D:
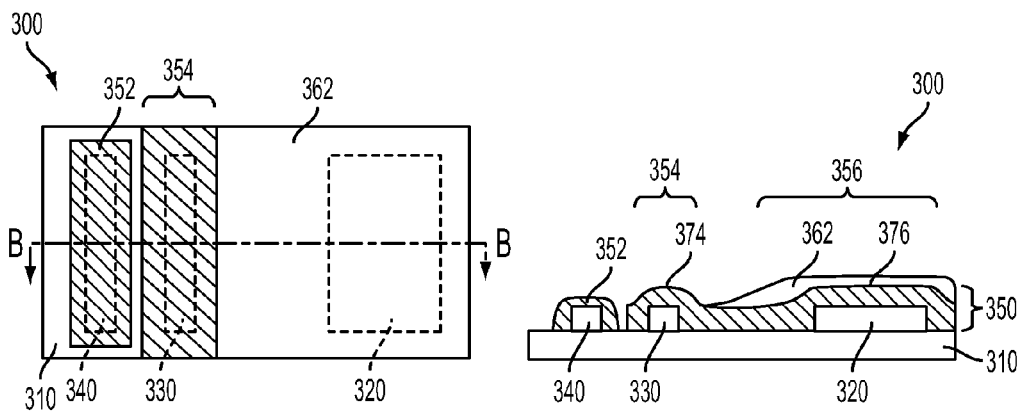

As depicted in FIG. 2 and FIG. 3D, in operation 250, a photoresist removal process is performed to expose an upper surface 374 of the portion 354 of the layer of material 350 over and covering the second supporting member 330, without exposing an upper surface 376 of the portion 356 of the layer of material 350. In some embodiments, the photoresist removal process includes performing an ashing process for a predetermined period of time sufficient to remove the photoresist material over the second supporting member 330 and the portion 354 of the layer of material 350.

Because of the thickness $T_2$ of the photoresist layer 360 over the second supporting member 330 is less than the thickness $T_1$ of the photoresist layer 360 over the first supporting member 330, a film of photoresist material (being referred to as a photoresist film 362) remains and covers at least the upper surface 376 of the portion 356 of the layer of material 350 over and covering the first supporting member 320.

Figure 3E:
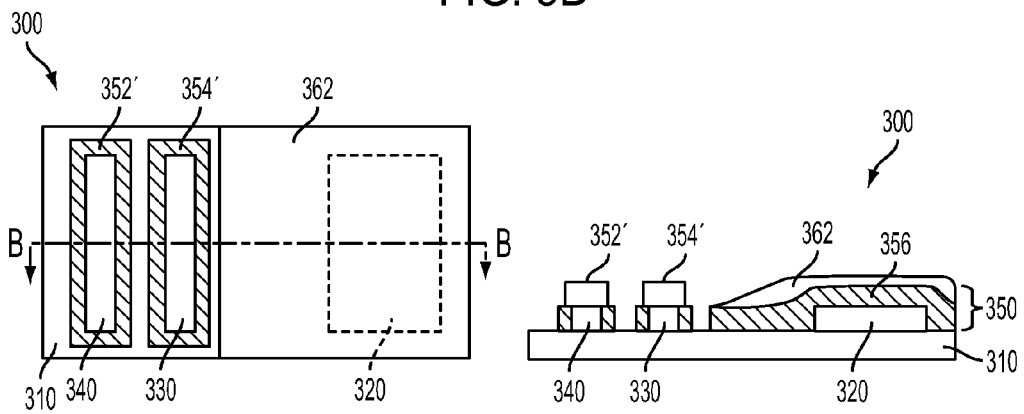

As depicted in FIG. 2 and FIG. 3E, in operation 260, the exposed portions 352 and 354 of the layer of material 350 are partially removed by performing an etching process in order to form spacers 352' and 354' surrounding the second supporting member 330 and the third supporting member 340. During the etching process, the photoresist film 362 is used, e.g., as a mask, to protect the portion 356 of the layer of material 350. The operation 260 is configured to reveal upper surfaces of the second and third supporting members 330 and 340. The operation 260 is also configured to form the spacers 352' and 354' each having a predetermined spacer width.

Figure 3F:
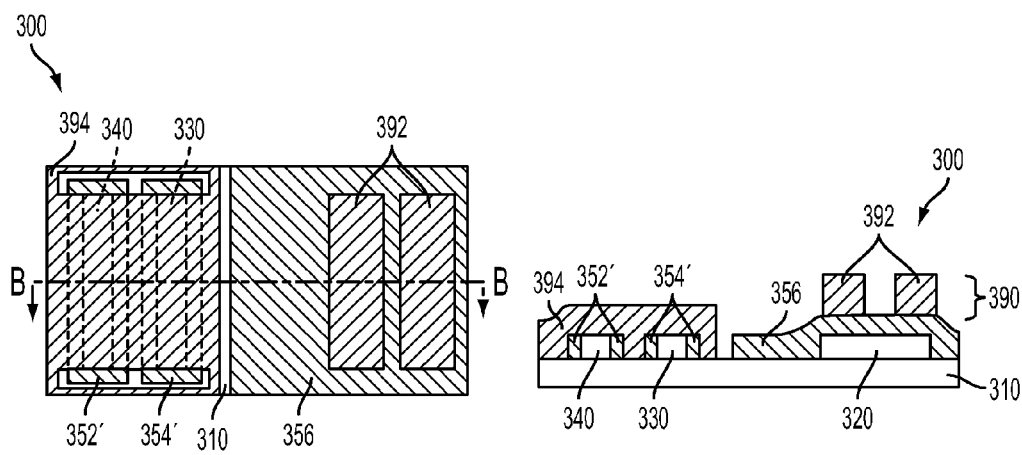

As depicted in FIG. 2 and FIG. 3F, in operation 270, the photoresist film 376 is removed. Another photoresist layer 390 is deposited or coated over the first, second, and third supporting members 320, 330, and 340. The photoresist layer 390 is subsequently patterned to form patterned photoresist feature 392 over the first supporting member and patterned photoresist feature 394 over the portion 356 of the layer of material 350 and the spacers 352' and 354'. The patterned photoresist features 392 and 394 are arranged to be masks for selectively etching the portion 356 of the layer of material 350 and the spacers 352' and 354'.

Figure 3G:
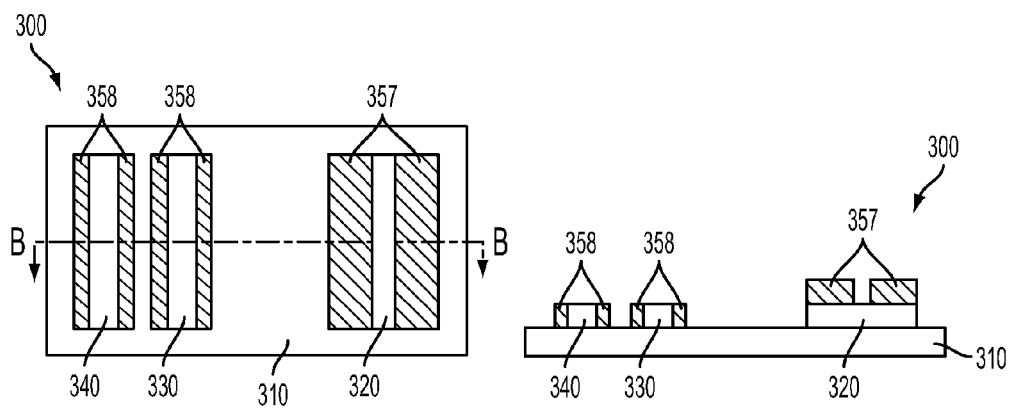

As depicted in FIG. 2 and FIG. 3G, in operation 280, the portion 356 of the layer of material 350 and the spacers 352' and 354' are further patterned, by using the patterned photoresist features 392 and 394 as masks in an etching process, to form patterned features 357 over the first supporting member 320 and strips 358 on sidewalls of the second and third supporting members 330 and 340. In some embodiments, the patterned features 357 correspond to the patterned feature 152 in FIG. 1, and the strips 358 correspond to the strips 154, 155, 156, and 157 in FIG. 1.

In some embodiments, the patterned features 357 are further processed for forming relatively larger components and devices such as capacitors, antennas, or resistors in an IC chip. In some embodiments, the strips 358 are processed for forming relatively smaller components and devices such as electrodes or dummy gate electrodes of transistors in the same IC chip.

The structure 100 is subject to multiple uses. In some embodiments, the structure 100 is an intermediate product used to form an integrated circuit chip. The method 200 is subject to many applications. In some embodiments, the method 200 constitutes a portion of a manufacturing process for making an integrated circuit chip.

One aspect of this description relates to a method of making a structure. The method includes forming a first supporting member over a substrate, the first supporting member comprising a first material and having a first width defined along a reference plane. The method further includes forming a second supporting member over the substrate, the second supporting member having a second width defined along the reference plane, and the first supporting member and the second supporting member being separated by a gap region. The first width being at least 10 times the second width, and a gap width of the gap region being from 5 to 30 times the second width.

Another aspect of this description relates to a method of making a structure. The method includes forming a first supporting member over a substrate, wherein the first supporting member has a first width. The method further includes forming a second supporting member over the substrate, wherein the second supporting member has a second width, and the second supporting member is spaced from the first supporting member by a gap width. The method further includes forming a material layer over the first supporting member and the second supporting member. The method further includes forming a photoresist layer over the material layer, wherein a thickness of the photoresist layer above the first supporting member is greater than a thickness of the photoresist layer above the second supporting member.

Still another aspect of this description relates to a method of making a structure. The method includes forming a first supporting member over a substrate, wherein the first supporting member has a first width. The method further includes forming a second supporting member over the substrate, wherein the second supporting member has a second width, and the second width is less than the first width. The method further includes forming a third supporting member over the substrate, wherein the third supporting member has a third width, the second supporting member is between the first supporting member and the third supporting member, and a ratio of the second width to the third width ranges from about 0.8 to about 1.2. The method further includes forming a trench between the seconds supporting member and the third supporting member, wherein a ratio of a width of the trench to the second width ranges from about 2.0 to about 3.0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a structure, the method comprising:
    forming a first supporting member over a substrate, the first supporting member comprising a first material and having a first width defined along a reference plane;
    forming a second supporting member over the substrate, the second supporting member having a second width defined along the reference plane, and the first supporting member and the second supporting member being separated by a gap region; and
    forming a third supporting member over the substrate, the third supporting member having a third width defined along the reference plane, and the third supporting member being farther from the first supporting member than the second supporting member,
    the first width being at least 10 times the second width, and a gap width of the gap region is from 5 to 30 times the second width.

2. The method of claim 1, further comprising:
    forming a layer of material over the substrate and covering, along the reference plane, the first supporting member and the second supporting member; and
    forming a photoresist layer over the layer of material, the photoresist layer having a first thickness over the first supporting member and a second thickness over the second supporting member, and the first thickness is greater than the second thickness.

3. The method of claim 2, further comprising performing a photoresist removal process to expose an upper surface of the layer of material over the second supporting member without exposing another upper surface of the layer of material over the first supporting member.

4. The method of claim 3, further comprising patterning the layer of material to form strips on sidewalls of the second supporting member.

5. The method of claim 4, further comprising removing the second supporting member after the formation of the strips.

6. The method of claim 3, further comprising forming another patterned photoresist layer over the first supporting member.

7. The method of claim 1, wherein the layer of material being formed over the third supporting member, and the method further comprising:
performing a photoresist removal process to expose an upper surface of the layer of material over the third supporting member without exposing other upper surfaces of the layer of material over the first supporting member and the second supporting member; and
partially removing the layer of material over the third supporting member.

8. The method of claim 1, wherein the second width ranges from 30 nm to 90 nm, the first width ranges from 300 nm to 900 nm, and the gap width ranges from 200 nm to 1,000 nm.

9. A method of making a structure, the method comprising:
forming a first supporting member over a substrate, wherein the first supporting member has a first width;
forming a second supporting member over the substrate, wherein the second supporting member has a second width, and the second supporting member is spaced from the first supporting member by a gap width;
forming a material layer over the first supporting member and the second supporting member; and
forming a photoresist layer over the material layer, wherein a thickness of the photoresist layer above the first supporting member is greater than a thickness of the photoresist layer above the second supporting member.

10. The method of claim 9, further comprising removing a portion of the photoresist above the second supporting member, wherein removing the portion of the photoresist above the second supporting member comprises maintaining the photoresist layer above the first supporting member.

11. The method of claim 9, further comprising patterning the material layer to form strips of material along sidewalls of the second supporting member.

12. The method of claim 11, wherein forming the strips of material comprises forming an electrode of a transistor or a dummy electrode of a transistor.

13. The method of claim 9, further comprising patterning the material layer to form at least one patterned feature over a top surface of the first supporting member.

14. The method of claim 13, wherein forming the at least one patterned feature comprises forming a capacitor, an antenna or a resistor.

15. The method of claim 9, wherein forming the material layer comprises forming the material layer comprising a conductive material.

16. A method of making a structure, the method comprising:
forming a first supporting member over a substrate, wherein the first supporting member has a first width;
forming a second supporting member over the substrate, wherein the second supporting member has a second width, and the second width is less than the first width;
forming a third supporting member over the substrate, wherein the third supporting member has a third width, the second supporting member is between the first supporting member and the third supporting member, and a ratio of the second width to the third width ranges from about 0.8 to about 1.2; and
forming a trench between the second supporting member and the third supporting member, wherein a ratio of a width of the trench to the second width ranges from about 2.0 to about 3.0.

17. The method of claim 16, further comprising forming at least one conductive feature over the first supporting member.

18. The method of claim 17, wherein forming the at least one conductive feature comprises:
forming a conductive layer over the first supporting member, the second supporting member and the third supporting member;
protecting the conductive layer adjacent to the second supporting member and the conductive layer adjacent to the third supporting member; and
patterning the conductive layer over the first supporting member while the conductive layer adjacent to the second supporting member and the third supporting member is protected.

19. The method of claim 16, further comprising forming conductive strips along opposite sidewalls of at least one of the second supporting member or the third supporting member.

20. The method of claim 1, wherein forming the third supporting member comprises forming the third supporting member wherein a ratio of the second width to the third width ranges from about 0.8 to about 1.2.

* * * * *